United States Patent
Deng et al.

(10) Patent No.: US 6,731,533 B2
(45) Date of Patent: May 4, 2004

(54) LOADLESS 4T SRAM CELL WITH PMOS DRIVERS

(75) Inventors: Xiaowei Deng, Plano, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 09/976,983

(22) Filed: Oct. 12, 2001

(65) Prior Publication Data

US 2002/0051379 A1 May 2, 2002

Related U.S. Application Data

(60) Provisional application No. 60/244,726, filed on Oct. 31, 2000.

(51) Int. Cl.[7] .............................................. G11C 11/00
(52) U.S. Cl. ...................................... 365/154; 365/156
(58) Field of Search ................................. 365/154, 156

(56) References Cited

U.S. PATENT DOCUMENTS

| | | | |
|---|---|---|---|
| 4,320,312 A | 3/1982 | Walker et al. | 365/154 |
| 5,684,735 A | 11/1997 | Kim | 365/154 |
| 6,044,011 A | 3/2000 | Marr et al. | 365/154 |
| 6,172,899 B1 | 1/2001 | Marr et al. | 365/154 |
| 6,172,901 B1 | 1/2001 | Portacci | 365/154 |
| 6,442,060 B1 * | 8/2002 | Leung et al. | 365/154 |

OTHER PUBLICATIONS

Noda K., et al., "A 1 9μm ²Loadless CMOS Four–Transistor SRAM Cell in a 0 18μm Logic Technology," 1998 IEEE, pp. 643–646.

Noda K., "An Ultra–High–Density High–Speed Loadless Four–Transistor SRAM Macro with a Dual–Layered Twisted Bit–Line and a Triple–Well Shield," 2000 IEEE Custom Intergrated Circuits Conference, pp. 283–296.

Takeda, Koichi, et al. "A 16Mb 400MHz Loadless CMOS Four–Transistor SRAM Macro," 2000 IEEE International Solid–State Circuits Conference, Feb. 8, 2000, Digest of Technical Papers, pp. 264–265.

Masuoka, S. et al., "A 0.99μm ²Loadless Four–Transistor SRAM Cell in 0.13μm Generation CMOS Technology," IEEE 2000 Symposium on VLSI Technology, Digest of Technical Papers, pp. 164–165.

* cited by examiner

Primary Examiner—Trong Phan

(57) ABSTRACT

The instant invention comprises a memory cell with PMOS drive transistors (170, 180) and NMOS pass transistors (150, 160). A NMOS transistor is connected between a storage node (230) and a bitline (200). The NMOS transistor is gated by the wordline (190). A PMOS drive transistor (180) is connected between the storage node (230) and a supply voltage (255).

1 Claim, 3 Drawing Sheets

LOADLESS 4T SRAM CELL WITH PMOS DRIVERS

This application claims priority under 35 USC §119(e)(1) of provisional application Ser. No. 60/244,726, tiled Oct. 31, 2000.

FIELD OF THE INVENTION

The invention is generally related to the field of SRAM circuits and more specifically to a novel design methodology for achieving a loadless 4T SRAM cell.

BACKGROUND OF THE INVENTION

The rapid growth of high-speed communications and 3-D graphics have created a large demand for large-scale and high speed static-random-access-memories (SRAM). SRAMs are essential to reduce data processing time and minimize chip cost. In general four-transistor (4T) SRAM cells have dominated the stand-alone SRAM market because they require less area than six-transistor (6T) SRAM cells. However for on-chip storage 4T SRAMs have not been used because they need a complex process to form a load element and have poor stability at low voltage. Recently, a 4T SRAM cell was developed that was suitable for on-chip SRAM memory. A schematic diagram of the conventional 4T SRAM cell is shown in FIG. 1. The cell comprises two NMOS drive transistors 60 and 70 and two PMOS transfer/load transistors 40 and 50. The wordline 30 and the bitline 10 and bitline/20 are connected to the PMOS transistors 40 and 50 as shown in the Figure. In operation assume that node 80 is charged high (i.e. logic 1) and node 90 charged low (i.e. logic 0). In standby mode wordline 30 and bitlines 10 and 20 are precharged to the supply voltage $V_{DD}$. This turns off the PMOS transistors 40 and 50 and, because node 80 is high and node 90 is low, NMOS transistor 70 is off and NMOS transistor 60 is on. For the SRAM cell to maintain its memory state without a refresh cycle, the off-state current of PMOS transistor 40, $I_{OFF-P}$, has to be equal to the sum of the off-state current of NMOS transistor 70, $I_{OFF-N}$, and the gate leakage current of transistor 60, $I_{GN}$ when $V_{go}$ is high enough to be stable. Simulated curves showing the relationship between these currents for a typical 4T SRAM cell as a function of temperature is shown in FIG. 2. Here it is observed that both the NMOS off-state current ($I_{OFF-N}$) 100 and the PMOS off-state current ($I_{OFF-P}$) 110 decreases with decreasing temperature. However, the gate leakage current ($I_{GN}$) 120 which is due to direct tunneling through the gate oxide is independent of temperature. Thus the sum of the gate leakage current 120 and the NMOS off-state current 100 becomes insensitive to changes in temperature in the temperature range where the gate leakage current dominates. In the instant case this occurs at about 40° C. as shown in FIG. 2. Therefore the 4T SRAM cell used to obtain the curves of FIG. 2 will be unable to maintain its memory state below about 40° C. (point x in FIG. 2) without a refresh operation such as a controlled lowering of the wordline voltage. The gate current leakage $I_{GN}$ is a function of gate oxide thickness and increases as the gate oxide thickness decreases. As the MOS device size is reduced the concurrent reduction in gate oxide thickness will result in an increase in the gate leakage current $I_{GN}$. This increase in gate leakage current $I_{GN}$ implies that as device dimensions are reduced greater increase in the pass gate leakage, such as by lowering the wordline voltage will be necessary to enable the 4T SRAM cell to hold its memory state. In order to increase the leakage to the high side (small voltage across pass gate transistor) the leakage to the low side (large voltage across pass gate transistor) results in greatly increased current and reduced performance. There is therefore a need for a SRAM memory cell with reduced area and reduced gate leakage current.

SUMMARY OF THE INVENTION

The instant invention is a memory cell which operates over a wide range of temperatures. In particular the memory cell comprises: providing a PMOS drive transistor with a gate terminal, a first source/drain terminal, and a second source/drain terminal; providing a NMOS pass transistor with a gate terminal, a first source/drain terminal and a second source/drain terminal; connecting said first source/drain terminal of said NMOS pass transistor to a bitline; connecting said second source/drain terminal of said NMOS pass transistor to a first storage node; connecting said gate terminal of said NMOS pass transistor to a wordline; connecting said first source/drain terminal of said PMOS drive transistor to a supply voltage; connecting said second source/drain terminal of said PMOS drive transistor to said first storage node; connecting said gate terminal of said PMOS drive transistor to a second storage node; and wherein a current flowing through the source/drain terminals of the NMOS pass transistor is greater than a current flowing through the source/drain terminals of the PMOS drive transistor for the same voltages applied between the gate and source/drain terminals of the PMOS drive transistor and the gate and source/drain terminals of the NMOS pass transistor.

Figure 1:
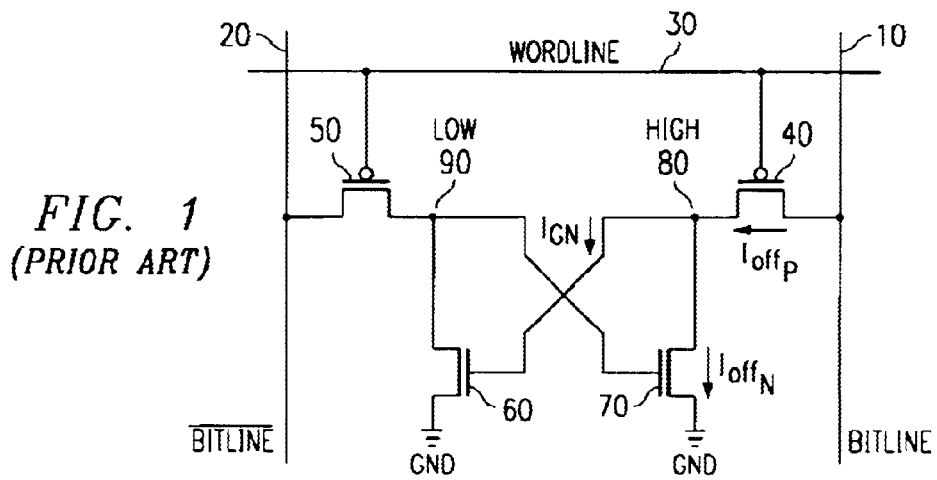
FIG. 1 is a circuit diagram showing a conventional 4T SRAM cell.
Figure 2:
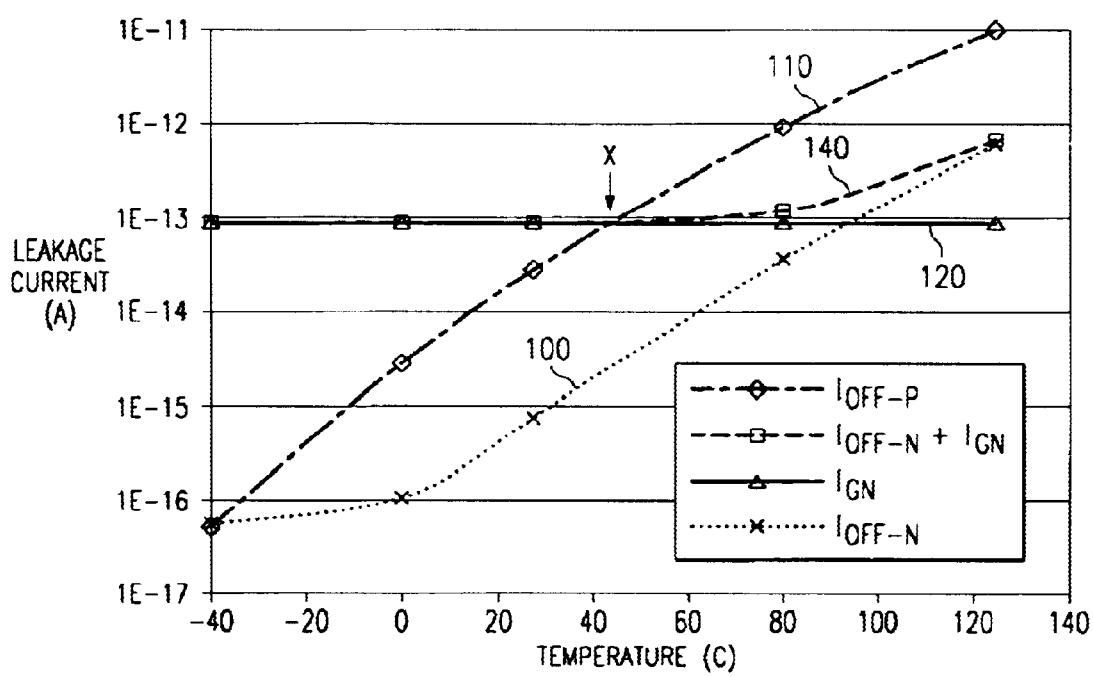
FIG. 2 is a plot of the various standby currents in the conventional SRAM cell shown in FIG. 1 as a function of temperature.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 3–6, the instant invention can be utilized in any semiconductor memory circuit.

Figure 3:
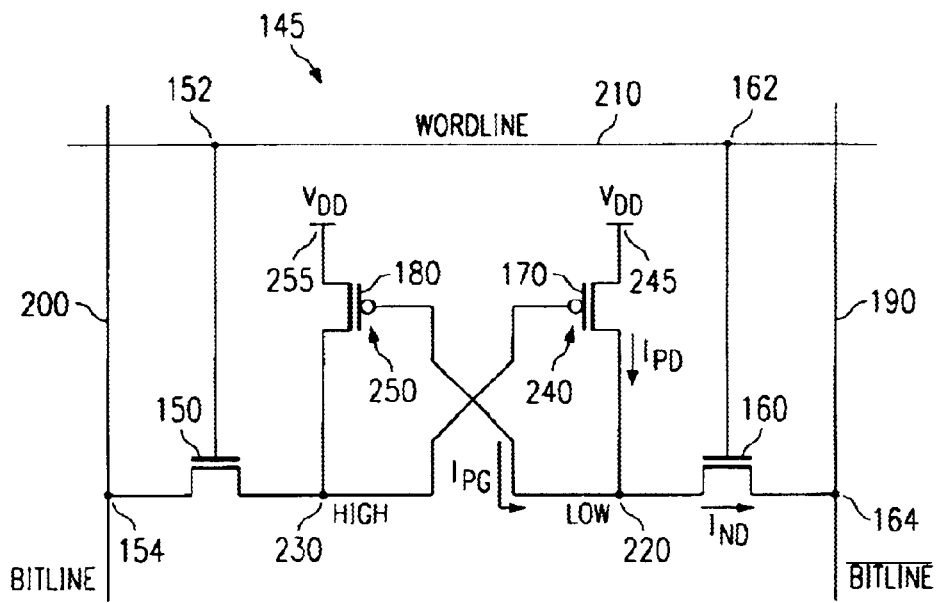
FIG. 3 is a circuit diagram showing an embodiment of the instant invention.

Shown in FIG. 3 is a 4T SRAM cell 145 which is an embodiment of the instant invention. A complete SRAM memory circuit will be formed by interconnecting many such SRAM cells. The SRAM cell 145 comprises two PMOS drive transistors 170 and 180 along with two NMOS pass transistors 150 and 160. The gate terminal 250 of PMOS drive transistor 180 is connected to a source/drain terminal of PMOS drive transistor 170 at node 220. Node 220 is a storage node of the memory cell. The gate terminal 240 of PMOS drive transistor 170 is connected to a source/drain terminal of PMOS drive transistor 180 at node 230. Node 230 is a second storage node of the memory cell. The remaining source/drain terminals of the PMOS drive transistors 180 and 170 are connected to the circuit supply voltage $V_{DD}$ at nodes 255 and 245 respectively. The gate terminal of NMOS pass transistor 160 is connected to the wordline 210 at node 162. The gate terminal of NMOS pass transistor 150 is connected to the wordline 210 at node 152. A source/drain terminal of NMOS transistor 160 is connected to storage node 220 and the other source/drain terminal of NMOS transistor 160 is connected to bitline 190 at node 164. In addition, a source/drain terminal of NMOS transistor 150 is connected to storage node 230 and the other source/drain terminal of NMOS transistor 150 is connected to bitline 200 at node 154. The embodiment of the 4T SRAM cell shown in FIG. 3 will function to hold its memory state in standby mode without refresh operations. A important condition for the memory cell 145 is that for the same voltages applied across the gate and source/drain terminals of the NMOS pass transistor (i.e., 150, 154, and 230) and the gate and source/drain terminals of PMOS drive transistor (i.e., 240, 220, and 245) the current which flows through the source/drain terminals (154 and 230) of the NMOS pass transistor must be greater than the current which flows through the source/drain terminals (245 and 220) of the PMOS drive transistor. The condition applies to all NMOS and PMOS transistors in the memory cell. This condition can be achieved using well known NMOS and PMOS transistor design and processing techniques.

Figure 4:
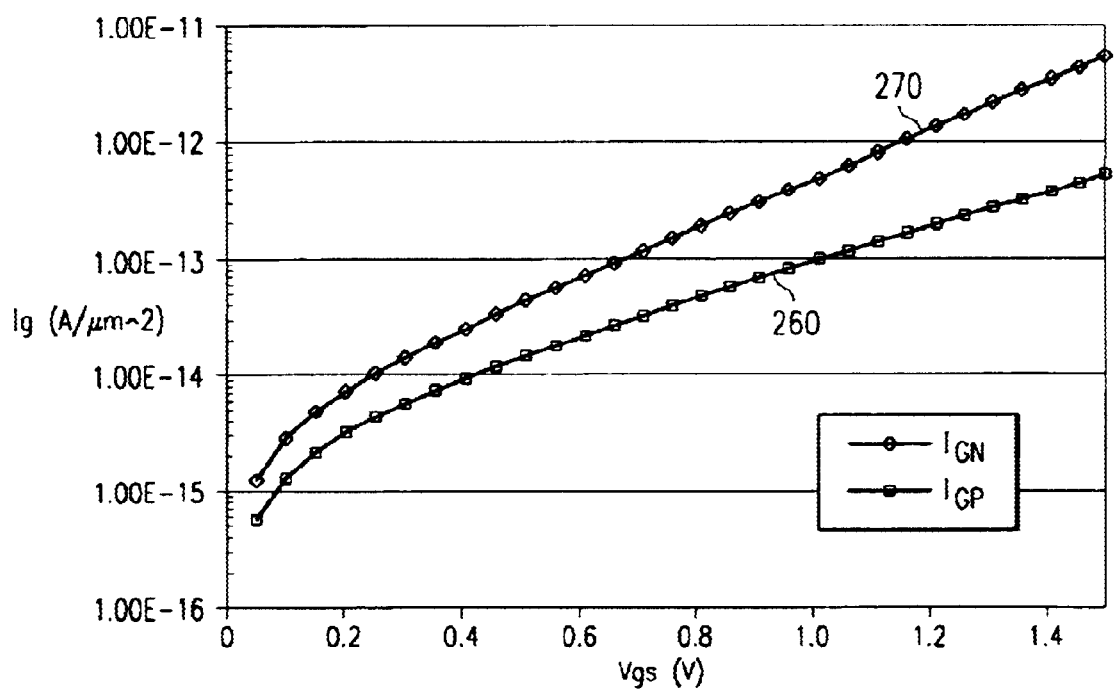
FIG. 4 is a plot showing the gate leakage currents for NMOS and PMOS transistors for the same gate oxide thickness.
Figure 5:
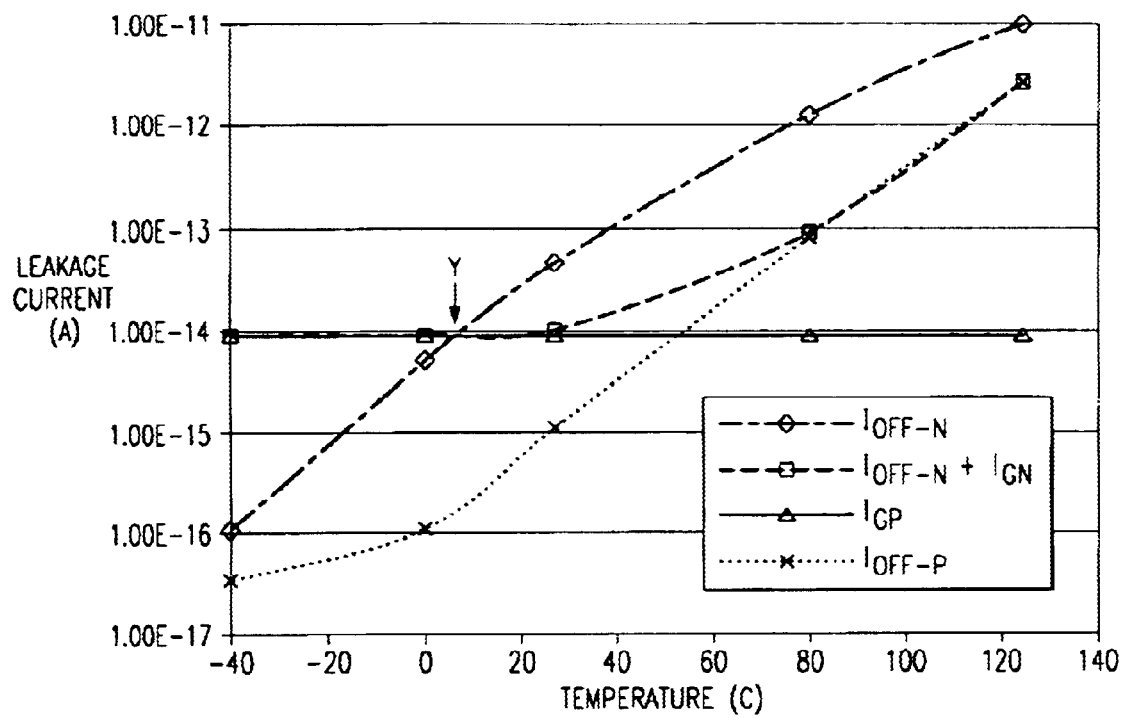
FIG. 5 is a plot of the various standby currents in the 4T SRAM cell of the embodiment of the instant invention shown in FIG. 3 as a function of temperature.
Figure 6:
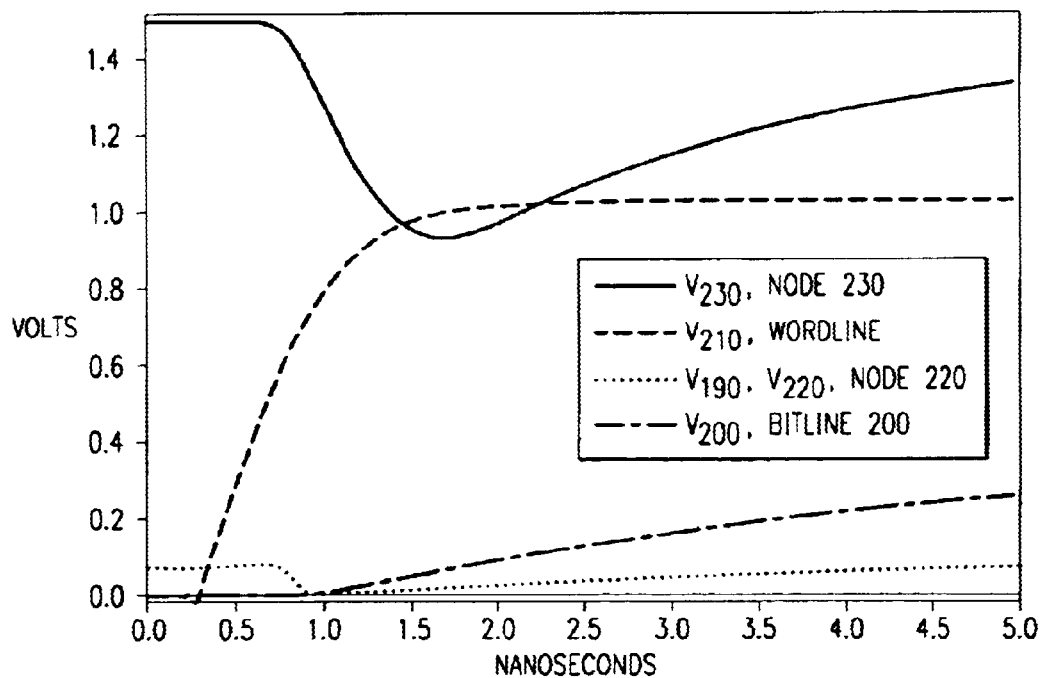
FIG. 6 is a plot showing various 4T SRAM node voltages during a read operation according to an embodiment of the instant invention.

In operation assume that the memory cell 145 is in the memory state where storage node 220 is low (i.e. close to 0V) and storage node 230 is high (i.e. at $V_{DD}$ the supply voltage). In the standby mode both bitlines 190 and 200 will be precharged low and the wordline 210 will be held low. In this state both pass transistors 150 and 160 will be off, PMOS transistor 180 will be on, and PMOS transistor 170 will be off. Here the ability of the cell 145 to hold its current memory state will depend on whether storage node 220 can be held low. For the cell 145 to hold storage node 220 low in standby mode, the NMOS off-state current $I_{OFF-N}$ must be greater than the sum of the PMOS off state current $I_{OFF-P}$ and the PMOS gate current $I_{GP}$. Therefore in the case of the instant invention, with the PMOS drive transistors 170 and 180, the ability to operate in standby without refresh operations is dependent on the level of the gate current of the PMOS transistor. This is to be compared to the conventional case (FIG. 1) where the operation is limited by the gate current of a NMOS transistor. A comparison of the direct tunneling gate currents for NMOS and PMOS transistors with the same gate oxide thickness is shown in FIG. 4. The gate current obtained from the PMOS transistor $I_{GP}$ 260 is about an order of magnitude less than the gate current obtained from the NMOS transistor $I_{GN}$ 270 at 1.5 Volts applied between the gate and the source terminals. This reduction in gate current is due to the reduced probability of hole tunneling through the gate oxide compared to the probability of electron tunneling through similar gate oxides. A plot of the NMOS transistor 160 off-state current, $I_{OFF-N}$, the PMOS transistor 170 off-state current, $I_{OFF-P}$, and the PMOS transistor 180 gate current, $I_{GP}$, as functions of temperature is shown in FIG. 5. Here it is observed that because of the reduction in PMOS transistor 180 gate current $I_{GP}$, the 4T SRAM memory cell 145 of the instant invention can operate down to temperatures of about 5° C.

(point Y in FIG. 5) without the need for refresh operations. This can be compared to the 40° C. minimum operation point obtained for a conventional 4T SRAM cell with similar gate oxide thickness. An important advantage of this embodiment of the instant invention is therefore an extension of the operating range of the memory cell without the need for refresh operations.

To write to the memory cell 145 shown in FIG. 3 the bitlines 190 and 200 are precharged to the desired memory state. For example line 190 could be precharged high and bitline 200 precharged low or vice versa. Following the precharging of the bitlines 190 and 200 to the desired memory state, the wordline 210 is moved from a low state to a high state. With the wordline 210 in a high state, the NMOS pass transistors 150 and 160 will switch on and storage nodes 220 and 230 will be forced to the states of bitlines 190 and 200 respectively.

In performing a read operation on the memory cell 145 in FIG. 3 the bitlines 190 and 200 are precharged to the low state. The wordline 210 is also initially held in the low state. Assume that the memory cell 145 is in the memory state where storage node 220 is in the low state and storage node 230 is in the high state. Therefore PMOS transistor 180 will be on and PMOS transistor 170 will be off. To perform the read operation, the wordline is moved from its low state to a high state. With the wordline now in a high state, the NMOS pass transistors 150 and 160 will switch on and changes in the voltages of the bitlines 190 and 200 will be sensed by amplifiers to determine the state of the memory cell. For the above case, proper operation of the cell during the read operation would require that bitline 200 be pulled to a high state by PMOS transistor 180. Due to the larger mobility of electrons compared to holes in the inversion channels of NMOS and PMOS transistors, NMOS transistors typically have larger drive currents than similarly sized PMOS transistors. Thus it is possible that during a read operation the storage node 230 could be pulled to a low state by NMOS pass-transistor 150. If storage node 230 is pulled to a low state then storage node 220 will be drive to a high state and the overall memory state of the cell will flip. This flipping of the memory state of the 4T cell 145 during a read operation is undesirable. To prevent flipping of the cell 145 during the read operation a number of schemes can be utilized. In one embodiment, during the read operation the wordline can be raised to a voltage less that the supply voltage. By limiting the voltage level of the wordline to less than ninety percent of the circuit supply voltage during a read operation the drive currents of the NMOS transistors 150 and 160 will be limited to values less than that required to flip the memory state of the cell. An embodiment of this read method is illustrated in the plot of voltage as a function of time shown in FIG. 6. In the Figure, the wordline voltage $V_{230}$ is raised to 1 volt which is below the circuit supply voltage of 1.5 volts. The voltage at node storage 230, $V_{230}$, decreases at first but remains above the voltage at storage node 220, $V_{220}$. The voltage of bitline 200, $V_{200}$, is pulled above the voltage of bitline 190, $V_{190}$, and this difference in voltage between bitlines 190 and 200 can be sensed by amplifiers to determine the memory state of the SRAM cell. In a second embodiment, a write-back operation is performed after each read operation to restore the cell to its pre-read memory state.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A memory cell, comprising:

providing a PMOS drive transistor with a gate terminal, a first source/drain terminal, and a second source/drain terminal;

providing a NMOS pass transistor with a gate terminal, a first source/drain terminal and a second source/drain terminal;

connecting said first source/drain terminal of said NMOS pass transistor to a bitline;

connecting said second source/drain terminal of said NMOS pass transistor to a first storage node;

connecting said gate terminal of said NMOS pass transistor to a wordline;

connecting said first source/drain terminal of said PMOS drive transistor to a supply voltage;

connecting said second source/drain terminal of said PMOS drive transistor to said first storage node;

connecting said gate terminal of said PMOS drive transistor to a second storage node; and wherein a current flowing through the source/drain terminals of the NMOS pass transistor is greater than a current flowing through the source/drain terminals of the PMOS drive transistor for the same voltages applied between the gate and source/drain terminals of the PMOS drive transistor and the gate and source/drain terminals of the NMOS pass transistor and during a read operation a voltage applied to the wordline is less than 90% of the supply voltage.

* * * * *